US012641721B2

(12) United States Patent
Mizutani

(10) Patent No.: US 12,641,721 B2
(45) Date of Patent: May 26, 2026

(54) WIRING SUBSTRATE

(71) Applicant: IBIDEN CO., LTD., Gifu (JP)

(72) Inventor: Yoshio Mizutani, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 220 days.

(21) Appl. No.: 18/469,675

(22) Filed: Sep. 19, 2023

(65) Prior Publication Data

US 2024/0098897 A1 Mar. 21, 2024

(30) Foreign Application Priority Data

Sep. 20, 2022 (JP) ................................. 2022-149450

(51) Int. Cl.
*H05K 1/11* (2006.01)
*H05K 3/00* (2006.01)
(52) U.S. Cl.
CPC ........... *H05K 1/113* (2013.01); *H05K 3/0094* (2013.01); *H05K 2201/0959* (2013.01); *H05K 2201/096* (2013.01); *H05K 2201/09618* (2013.01)
(58) Field of Classification Search
CPC ........ H05K 1/11; H05K 1/113; H05K 3/0094; H05K 3/42; H05K 2201/0959; H05K 2201/096
USPC ....................................................... 174/262
See application file for complete search history.

(56) References Cited

U.S. PATENT DOCUMENTS

2016/0042861 A1* 2/2016 Mano .................... H01F 27/245
336/200

FOREIGN PATENT DOCUMENTS

JP 2014-192432 A 10/2014

* cited by examiner

*Primary Examiner* — Tremesha W Burns
(74) *Attorney, Agent, or Firm* — Finnegan, Henderson, Farabow, Garrett & Dunner, LLP

(57) ABSTRACT

A wiring substrate includes an insulating layer having through holes, a first conductor layer formed on first surface of the insulating layer, a second conductor layer formed on second surface of the insulating layer, and interlayer conductors formed along wall surfaces surrounding the through holes such that each interlayer conductor has a film-like shape and is connecting the first and second conductor layers. The interlayer conductors include first conductors formed in first region of the insulating layer and second conductors formed in second region of the insulating layer at density higher than density of the first conductors, and a thickness of each first interlayer conductor in its end part is substantially same as or larger than a thickness of each second conductor in its end part and a thickness of each first conductor in its center part is larger than a thickness of each second conductor in its center part.

20 Claims, 6 Drawing Sheets

WIRING SUBSTRATE

CROSS-REFERENCE TO RELATED APPLICATIONS

The present application is based upon and claims the benefit of priority to Japanese Patent Application No. 2022-149450, filed Sep. 20, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-192432 describes a wiring substrate in which three groups of through holes are respectively formed at mutually different densities in regions of a core substrate. The entire contents of this publication are incorporated herein by reference.

SUMMARY OF THE INVENTION

According to one aspect of the present invention, a wiring substrate includes an insulating layer having through holes, a first conductor layer formed on a first surface of the insulating layer, a second conductor layer formed on a second surface of the insulating layer, and interlayer conductors formed along wall surfaces surrounding the through holes respectively such that each of the interlayer conductors has a film-like shape and is connecting the first conductor layer and the second conductor layer. The interlayer conductors include first interlayer conductors formed in a first region of the insulating layer and second interlayer conductors formed in a second region of the insulating layer at a density higher than a density of the first interlayer conductors in the first region, and the interlayer conductors are formed such that a thickness of each of the first interlayer conductors in an end part of each of the first interlayer conductors is substantially same as or larger than a thickness of each of the second interlayer conductors in an end part of each of the second interlayer conductors and that a thickness of each of the first interlayer conductors in a center part of each of the first interlayer conductors is larger than a thickness of each of the second interlayer conductors in a center part of each of the second interlayer conductors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
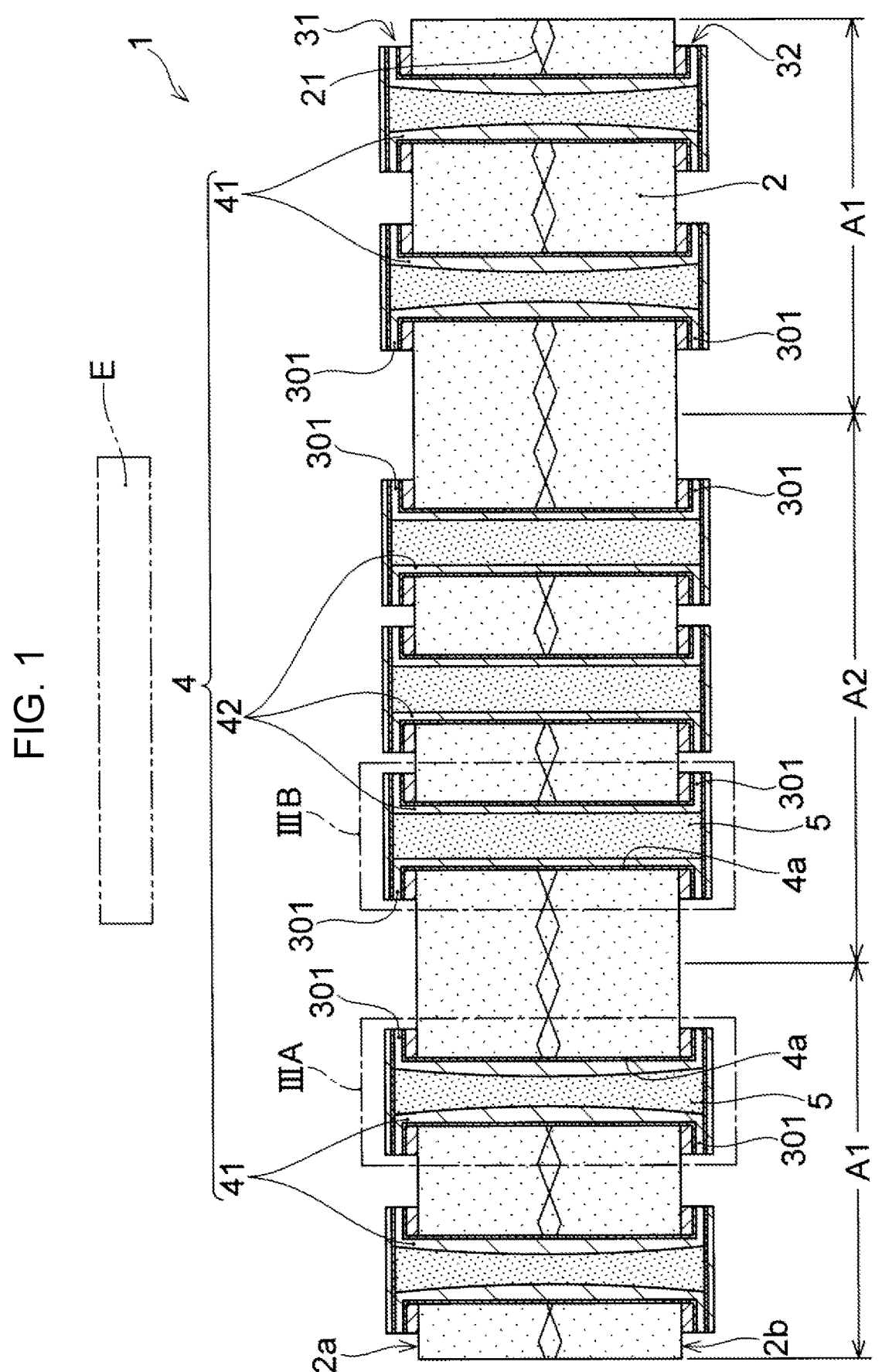
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
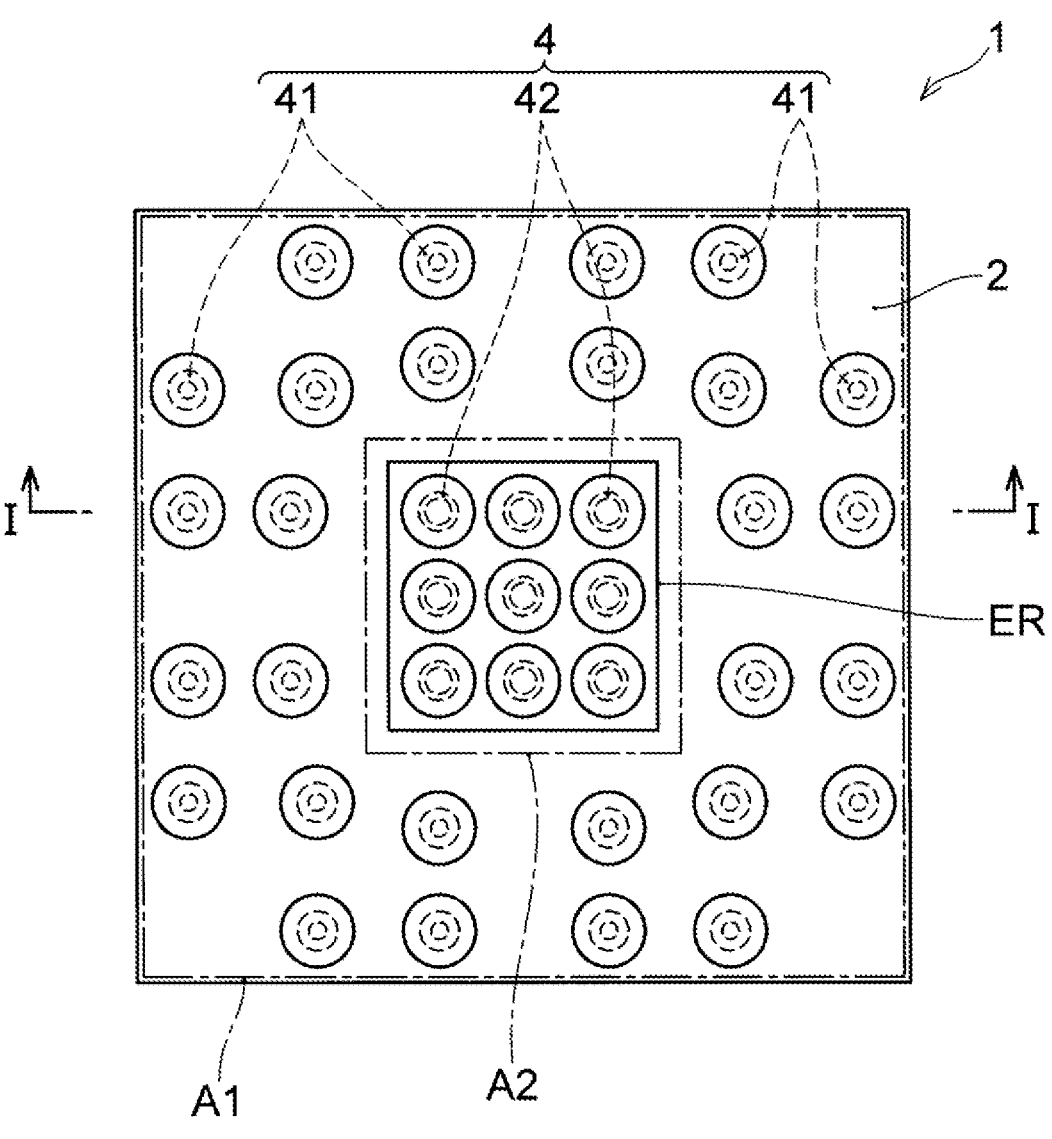
FIG. 2 is a plan view of the wiring substrate of FIG. 1.
Figures 3A, 3B:
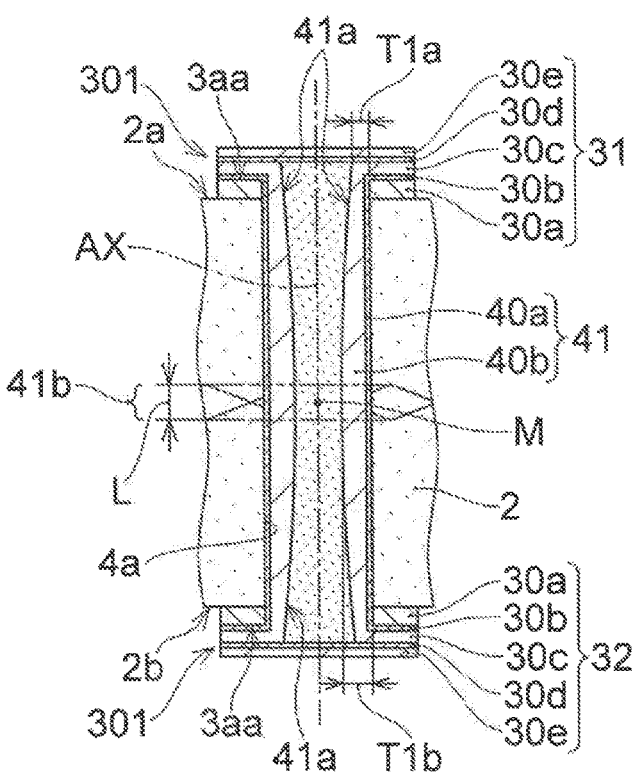
FIG. 3A is an enlarged view of a portion (IIIA) of FIG. 1.
FIG. 3B is an enlarged view of a portion (IIIB) of FIG. 1.

A wiring substrate according to an embodiment of the present invention is described with reference to the drawings. FIG. 1 illustrates a cross-sectional view of a wiring substrate 1, which is an example of the wiring substrate of the present embodiment. FIG. 2 illustrates a plan view of the wiring substrate 1 of FIG. 1. FIG. 1 is a cross-sectional view of the wiring substrate 1 along an I-I line illustrated in FIG. 2. FIG. 3A illustrates an enlarged view of a portion (IIIA) of FIG. 1, and FIG. 3B illustrates an enlarged view of a portion (IIIB) of FIG. 1. The wiring substrate 1 is merely an example of the wiring substrate of the embodiment. For example, the number of conductor layers and the number of insulating layers included in the wiring substrate of the embodiment are not limited to the number of conductor layers and the number of insulating layers included in the wiring substrate 1 of FIG. 1. That is, the wiring substrate of the embodiment can include any number of insulating layers and conductor layers in addition to the insulating layers and conductor layers of the wiring substrate 1. In the drawings to be referenced in the following description, in order to facilitate understanding of an embodiment to be disclosed, a specific portion may be depicted in an enlarged manner and it may be possible that structural elements are not depicted in precise proportions in terms of size or length relative to each other.

As illustrated in FIG. 1, the wiring substrate 1 includes: an insulating layer 2; a conductor layer 31 (first conductor layer) and a conductor layer 32 (second conductor layer) that are respectively formed on surfaces of the insulating layer 2; and multiple interlayer conductors 4 that connect the conductor layer 31 and the conductor layer 32. The insulating layer 2 has a first surface ($2a$) and a second surface ($2b$) as two surfaces that are substantially orthogonal to a thickness direction of the wiring substrate 1 and oppose each other. The conductor layer 31 is formed on the first surface ($2a$) and the conductor layer 32 is formed on the second surface ($2b$). The insulating layer 2 further has multiple through holes ($4a$) penetrating between the first surface ($2a$) and the second surface (2b). The multiple interlayer conductors 4 are formed in a form of films along inner walls of the multiple through holes (4a). That is, the interlayer conductors 4 each have a partially film-like structure and, as a whole, a tubular structure with a hollow part. The hollow part of each of the tubular interlayer conductors 4 is filled, for example, with a filling body 5 formed of any resin such as an epoxy resin. A component (E) is mounted on the wiring substrate 1 in the example of FIG. 1.

The interlayer conductors 4 that penetrate the insulating layer 2 and connect two conductor layers (the conductor layer 31 and the conductor layer 32 in the example of FIG. 1) can be so-called through-hole conductors. The interlayer conductors 4 are also referred to as via conductors. However, the interlayer conductors 4 are not conductors connecting a conductor layer covered by the insulating layer 2 to another conductor layer, but are conductors connecting the conductor layers that are respectively directly formed on the two surfaces of the insulating layer 2 that intersect the thickness direction.

The wiring substrate 1 of FIG. 1 includes only the insulating layer 2, the conductor layer 31, the conductor layer 32, and the interlayer conductors 4. However, as described above, the wiring substrate of the embodiment may further include one or more pairs of insulating layers and conductor layers on each of the first surface (2a) side and the second surface (2b) side of the insulating layer 2. In this case, the insulating layer 2 and the conductor layers (31, 32) may be formed as a core substrate of the wiring substrate of the embodiment and function as a core substrate. In that case, the interlayer conductors 4 can be through-hole conductors that penetrate the insulating layer of the core substrate and connect the conductor layers on both sides thereof.

As illustrated in FIGS. 1 and 2, the wiring substrate 1 has a first region (A1) and a second region (A2) in each of which some of the multiple interlayer conductors 4 are formed. The first region (A1) and the second region (A2) are separate regions. The first region (A1) and the second region (A2) are regions where densities of the interlayer conductors 4 in a plan view are different from each other. The term "plan view" means viewing an object along the thickness direction of the wiring substrate of the embodiment.

As illustrated in FIG. 2, in the example of FIGS. 1 and 2, the second region (A2) occupies a center part of the wiring substrate 1 in a plan view. And, the first region (A1) occupies a region on an outer side of the second region (A2) in a plan view, surrounding the second region (A2). As illustrated in FIG. 2, the second region (A2) entirely overlaps with a component region (ER), which is a region where the component (E) illustrated in FIG. 1 is positioned, in a plan view. On the other hand, the first region (A1) partially overlaps with the component region (ER) in a plan view. However, positions, sizes, and shapes of the first region (A1) and the second region (A2) in the wiring substrate 1 in a plan view are not limited to those in the example of FIGS. 1 and 2. The first region (A1) and the second region (A2) can each have any size and shape at any position in the wiring substrate 1 in a plan view. The component (E) can be, for example, any semiconductor integrated circuit device such as a microcontroller or a memory, as well as an individual semiconductor element, or a passive element such as a resistor array.

In this way, in the wiring substrate 1 having the first region (A1) and the second region (A2), the multiple interlayer conductors 4 include first interlayer conductors 41 formed in the first region (A1) and second interlayer conductors 42 formed in the second region (A2). The second interlayer conductors 42 are formed in the second region (A2) at a higher density compared to a density of the first interlayer conductors 41 in the first region (A1). That is, a density of multiple interlayer conductors 4 in the second region (A2) is higher than a density of the multiple interlayer conductors 4 in the first region (A1). For example, the density of the first interlayer conductors 41 in the first region (A1) can be 0.6 conductors/mm2 or more and 1.2 conductors/mm2 or less. On the other hand, the density of the second interlayer conductors 42 in the second region (A2) can be 6 conductors/mm2 or more and 10 conductors/mm2 or less.

The first interlayer conductors 41 and the second interlayer conductors 42 are each capable of propagating any electrical signal. Further, any electric potential can be applied to each of the first interlayer conductors 41 and the second interlayer conductors 42. For example, electrical signals with time-dependent signal level transitions may propagate through the first interlayer conductors 41, and a ground potential or a specific power supply potential may be applied to the second interlayer conductors 42.

The insulating layer 2 is formed, for example, using an insulating resin. Examples of the insulating resin forming the insulating layer 2 include thermosetting resins such as an epoxy resin, a bismaleimide triazine resin (BT resin), and a phenol resin. However, the material of the insulating layer 2 is not limited to these exemplified thermosetting resins. For example, the insulating layer 2 can be formed using any material, such as a thermoplastic resin, that allows the insulating layer 2 to have suitable insulation performance and rigidity. In the example of FIG. 1, the insulating layer 2 contains, for example, a reinforcing material (core material) 21 formed of a glass fiber, an aramid fiber, or the like. The insulating layer 2 may further contain an inorganic filler (not illustrated) formed of silica, alumina, or the like. The insulating layer 2 can have a thickness of, for example, 1.0 mm or more and 2.0 mm or less.

In the example of FIGS. 1 and 2, the conductor layer 31 and the conductor layer 32 each include only conductor pads 301 that are connected to the interlayer conductors 4. The conductor pads 301 can be so-called through-hole pads when the interlayer conductors 4 are through-hole conductors as described above. However, in the wiring substrate 1 of the present embodiment, the conductor layers (31, 32) can each include any conductor patterns.

The conductor layer 31, the conductor layer 32, and the interlayer conductors 4 are each formed, for example, using any metal such as copper or nickel. The conductor layer 31, the conductor layer 32, and the interlayer conductors 4 are each formed of metal films formed by electroless plating, electrolytic plating, sputtering, or the like. The conductor layers (31, 32) can each further include a metal foil such as a copper foil or a nickel foil as a structural element. That is, as clearly illustrated in FIGS. 3A and 3B, the conductor layer 31, the conductor layer 32, and the interlayer conductors 4 can each have a multi-layer structure including two or more metal films.

FIG. 3A is an enlarged view of a portion (IIIA) of FIG. 1, that is, an enlarged view of a first interlayer conductor 41 and a conductor pad 301 connected to the first interlayer conductor 41, and FIG. 3B is an enlarged view of a portion (IIIB) of FIG. 1, that is, an enlarged view of a second interlayer conductor 42 and a conductor pad 301 connected to the second interlayer conductor 42. As illustrated in FIGS. 3A and 3B, in the wiring substrate 1 of the example of FIG. 1, the conductor pads 301, that is, the conductor layer 31 and the conductor layer 32, each have a five-layer structure. Specifically, the conductor layer 31 and the conductor layer 32 are each formed of a first layer (30a), a second layer (30b), a third layer (30c), a fourth layer (30d), and a fifth layer (30e), which are sequentially laminated on the first surface (2a) or the second surface (2b) of the insulating layer 2.

The first layer (30a) can be, for example, a metal foil layer formed of a copper foil, a nickel foil, or the like. The second layer (30b) and the fourth layer (30d) can be, for example, metal film layers each formed of an electroless plating film or a sputtering film. The third layer (30c) and the fifth layer (30e) may be metal film layers each formed of an electrolytic plating film. It is not always necessary for the conductor layer 31 and the conductor layer 32 to each have the five-layer structure illustrated FIGS. 3A and 3B. For example, it is also possible that the conductor layer 31 and the conductor layer 32 do not each include the first layer (30a), which is a metal foil layer. Further, it is also possible that the conductor layer 31 and the conductor layer 32 do not each include the fourth layer (30d) and the fifth layer (30e).

On the other hand, the first interlayer conductors 41 and the second interlayer conductors 42 are each formed of two films, including: a lower-layer film (40a) that is in contact with a wall surface of the insulating layer 2 surrounding the through holes (4a); and an upper-layer film (40b) that is formed on the lower-layer film (40a). The lower-layer film (40a) can be, for example, a metal film formed of an electroless plating film or a sputtering film, and the upper-layer film (40b) can be a metal film formed of an electrolytic plating film. The lower-layer film (40a) is integrally formed with the second layer (30b) of each of the conductor layers (31, 32) and is continuous with the second layer (30b). The upper-layer film (40b) is integrally formed with the third layer (30c) of each of the conductor layers (31, 32) and is continuous with the third layer (30c). That is, the metal film forming the lower-layer film (40a) is formed not only in the through holes (4a) but also on the first layer (30a) of each of the conductor layers (31, 32). Similarly, the metal film forming the upper-layer film (40b) is formed not only in the through holes (4a), but also on the second layer (30b) of each of the conductor layers (31, 32).

The through holes (4a) penetrate the insulating layer 2 in its thickness direction. In the example of FIGS. 3A and 3B, further, the through holes (4a) also penetrate the first layer (30a) of each of the conductor layers (31, 32) and open on an upper surface (3aa) of the first layer (30a) (surface on the opposite side with respect to the insulating layer 2). The lower-layer film (40a) of each of the first and second interlayer conductors (41, 42) is formed continuously with the second layer (30b) of each of the conductor layers (31, 32) via opening parts of the through holes (4a) on each of the first surface (2a) side and the second surface (2b) side of the insulating layer 2. Similarly, the upper-layer film (40b) of each of the first and second interlayer conductors (41, 42) is formed continuously with the third layer (30c) of each of the conductor layers (31, 32) via the opening parts of the through holes (4a).

In the example of FIGS. 3A and 3B, the through holes (4a) each have a substantially constant inner diameter over an entire length from the first surface (2a) to the second surface (2b). Therefore, the first and second interlayer conductors (41, 42) each have a substantially constant outer diameter over the entire length from the first surface (2a) to the second surface (2b). The inner diameter of each of the through holes (4a) and the outer diameter of each of the first and second interlayer conductors (41, 42) are each, for example, 150 μm or more and 200 μm or less. For convenience, the terms "inner diameter" and "outer diameter" are used. However, a shape of a cross section of each of the through holes (4a) and the first and second intensified conductors (41, 42) (cross section orthogonal to the thickness direction of the insulating layer 2) is not limited to a circular or elliptical shape. The "inner diameter" of each of the through holes (4a) and the "outer diameter" of each of the first and second interlayer conductors (41, 42) are each a longest distance between any two points on an outer perimeter of a cross section orthogonal to an axial direction of each of the through holes (4a) or each of the interlayer conductors (the thickness direction of the insulating layer 2). In the wiring substrate of the embodiment, the inner diameter of each of the through holes (4a) and the outer diameter of each of the interlayer conductors may vary between the first surface (2a) and the second surface (2b), different from the example of FIGS. 3A and 3B.

In the wiring substrate 1 of the present embodiment, a thickness (T1b) (first center part thickness) of a center part (41b) of each of the first interlayer conductors 41 in the thickness direction of the insulating layer 2 is larger than a thickness (T2b) (second center part thickness) of a center part (42b) of each of the second interlayer conductors 42 in the thickness direction of the insulating layer 2. On the other hand, a thickness (T1a) (first end part thickness) of an end part (41a) of each of the first interlayer conductors 41 in the thickness direction of the insulating layer 2 is substantially the same as or larger than a thickness (T2a) (second end part thickness) of an end part (42a) of each of the second interlayer conductors 42 in the thickness direction of the insulating layer 2.

That is, the thickness (T1b) of the center part (41b) of each of the first interlayer conductors 41, which are formed with a lower density that the second interlayer conductors 42, is larger than the thickness (T2b) of the center part (42b) of each of the second interlayer conductors 42, and the thickness (T1a) of the end part (41a) of each of the first interlayer conductors 41 is not smaller than the thickness (T2a) of the end part (42a) of each of the second interlayer conductors 42. Therefore, it is thought that electrical resistance of each of the first interlayer conductors 41 is smaller than electrical resistance of each of the second interlayer conductors 42 (the "electrical resistance" of each of the first interlayer conductors 41 and the second interlayer conductors 42 is electrical resistance between two ends in the axial direction of each of the interlayer conductors).

When a conductor pattern of the conductor layer 31 and a conductor pattern of the conductor layer 32 (hereinafter also referred to as "front and back conductor patterns") are connected by one or more interlayer conductors 4 (see FIG. 1), electrical resistance between the front and back conductor patterns is, in principle, inversely proportional to the number of the interlayer conductors 4, that is, the number of the first interlayer conductors 41 or the second interlayer conductors 42, connecting the front and back conductor patterns. The second interlayer conductors 42 in the second region (A2) are formed at a higher density than the first interlayer conductors 41 in the first region (A1). Therefore, depending on a difference in the number of conductors between these interlayer conductors, a difference may occur between the electrical resistance between the front and back conductor patterns in the second region (A2) and the electrical resistance between the front and back conductor patterns in the first region (A1). That is, the electrical resistance between the front and back conductor patterns may vary between the regions of the wiring substrate 1 in a plan view.

However, in the present embodiment, as described above, the thickness (T1$b$) of the center part (41$b$) of each of the first interlayer conductors 41 is larger than the thickness (T2$b$) of the center part (42$b$) of each of the second interlayer conductors 42, and the thickness (T1$a$) of the end part (41$a$) of each of the first interlayer conductors 41 is equal to or larger than the thickness (T2$a$) of the end part (42$a$) of each of the second interlayer conductors 42. As a result, each of the first interlayer conductors 41 can have a smaller electrical resistance than each of the second interlayer conductors 42. Therefore, it is thought that the difference between the electrical resistance between the front and back conductor patterns in the first region (A1) and the electrical resistance between the front and back conductor patterns in the second region (A2), which is due to the difference in density between the first interlayer conductors 41 and the second interlayer conductors 42, is reduced. Therefore, in the wiring substrate 1, it may be possible that desired electrical characteristics can be easily obtained.

The thickness of each of the first interlayer conductors 41 and the second interlayer conductors 42 is a distance between an outer and an inner wall of each of the interlayer conductors in a radial direction from a central axis (AX) of each of the interlayer conductors and the through holes (4$a$). When the thickness of each of the interlayer conductors is not constant in a circumferential direction with respect to the central axis (AX), an intermediate thickness between a maximum thickness and a minimum thickness is the thickness of each of the interlayer conductors.

Further, "the thickness (T1$a$) of the end part (41$a$)" of each of the first interlayer conductors 41 and "the thickness (T2$a$) of the end part (42$a$)" of each of the second interlayer conductors 42 are each a thickness of each of the interlayer conductors at a front end in the axial direction of each of the through holes (4$a$). That is, in the example of FIGS. 3A and 3B, a thickness of each of the interlayer conductors at a position of the upper surface (3$aa$) of the first layer (30$a$) of each of the conductor layers (31, 32) is the thickness (T1$a$) of the end part (41$a$) or the thickness (T2$a$) of the end part (42$a$) of each of the interlayer conductors. As described above, since it is not always necessary for the first layer (30$a$) to be provided, when the first layer (30$a$) is not provided, a thickness of each of the interlayer conductors at a position of the first surface (2$a$) or the second surface (2$b$) of the insulating layer 2 is the thickness (T1$a$) of the end part (41$a$) or the thickness (T2$a$) of the end part (42$a$) of each of the interlayer conductors.

In a comparison between the thickness (T1$a$) of the end part (41$a$) of each of the first interlayer conductors 41 and the thickness (T2$a$) of the end part (42$a$) of each of the second interlayer conductors 42, for example, the thickness (T1$a$) and the thickness (T2$a$) on the first surface (2$a$) side of the insulating layer 2 are compared. Or, the thickness (T1$a$) and the thickness (T2$a$) on the second surface (2$b$) side of the insulating layer 2 may be compared, or the thicknesses of the end parts of the interlayer conductors on each of both sides may be compared.

Further, "the thickness (T1$b$) of the center part (41$b$)" of each of the first interlayer conductors 41 is a maximum thickness in the center part (41$b$) of each of the first interlayer conductors 41, and "the thickness (T2$b$) of the center part (42$b$)" of each of the second interlayer conductors 42 is a maximum thickness in the center part (42$b$) of each of the second interlayer conductors 42. The "center part (41$b$)" and the "center part (42$b$)" are each a portion that has a length (L) of 10% of the thickness of the insulating layer 2 and shares an axial-direction midpoint (M) with each of the interlayer conductors.

As described above, in the present embodiment, the thickness (T1$a$) of the end part (41$a$) of each of the first interlayer conductors 41 is substantially the same as or larger than the thickness (T2$a$) of the end part (42$a$) of each of the second interlayer conductors 42. That is, the thickness (T1$a$) of the end part (41$a$) of each of the first interlayer conductors 41, which are formed at a lower density that the second interlayer conductors 42, can be substantially the same as the thickness (T2$a$) of the end part (42$a$) of each of the second interlayer conductors 42. For such a wiring substrate of the embodiment, in a region where a density of so-called through-hole conductors such as the first interlayer conductors 41 penetrating an insulating layer is low, when the through-hole conductors are formed by electrolytic plating, a relatively thick plating film is likely to be formed on the insulating layer compared to a region of a high density. On the other hand, a relatively thin plating film is likely to be formed in a region where a density of through-hole conductors is high. Therefore, it may be possible that unevenness occurs on a surface of a conductor layer formed on the insulating layer and, for example, a component cannot be properly mounted on the wiring substrate.

However, in the present embodiment, as described above, for the first interlayer conductors 41 and the second interlayer conductors 42, which are formed at mutually different densities, the thickness (T1$a$) of the end part (41$a$) of each of the first interlayer conductors 41 and the thickness (T2$a$) of the end part (42$a$) of each of the second interlayer conductors 42 can be substantially the same. Even when the thickness (T1$a$) and the thickness (T2$a$) are different from each other, it is estimated that the difference is not large. Therefore, it is thought that a thickness of the second layer (30$b$) and third layer (30$c$) on the first surface (2$a$) around the first interlayer conductors 41 and a thickness of the second layer (30$b$) and third layer (30$c$) on the first surface (2$a$) around the second interlayer conductors 42 also can be substantially the same, and even when these thicknesses are different from each other, it is thought that the difference is not large. The same applies to the second surface (2$b$) side. Therefore, according to the present embodiment, in each of the conductor layer 31 and the conductor layer 32, it is thought that a difference in thickness between the first region (A1) and the second region (A2) is unlikely to occur and unevenness on a surface of each of the conductor layers is unlikely to occur. Therefore, it may be possible that a component can be properly mounted on the wiring substrate 1 of the present embodiment and high mounting quality can be obtained.

In such a wiring substrate 1 of the embodiment, a difference (first difference) between the thickness (T1$b$) of the center part (41$b$) of each of the first interlayer conductors 41 and the thickness (T2$b$) of the center part (42$b$) of each of the second interlayer conductors 42 may be larger than a difference (second difference) between the thickness (T1$a$) of the end part (41$a$) of each of the first interlayer conductors 41 and the thickness (T2$a$) of the end part (42$a$) of each of the second interlayer conductors 42. As described above, it may be possible that surface unevenness in the conductor layer 31 and the conductor layer 32 is unlikely to occur and a difference in electrical resistance between the first region (A1) and the second region (A2) is reduced. Preferably, the first difference (difference between the thickness (T1$b$) and the thickness (T2$b$)) is two or more and five or less times the second difference (difference between the thickness (T1$a$)

and the thickness (T2*a*)). It may be possible that the above-described effect of suppressing occurrence of unevenness in the surfaces of the conductor layers (31, 32) and effect of reducing the difference in electrical resistance between the first and second regions (A1, A2) are obtained, and at the same time, the formation of the first and second interlayer conductors (41, 42) does not require excessive time.

When the thickness (T1*a*) of the end part (41*a*) of each of the first interlayer conductors 41 is different between the first surface (2*a*) side and the second surface (2*b*) side of the insulating layer 2, an intermediate thickness between the thickness of the first surface (2*a*) side and the thickness of the second surface (2*b*) side is compared with the thickness (T2*a*) of the end part (42*a*) of each of the second interlayer conductors 42. Similarly, when the thickness (T2*a*) of the end part (42*a*) of each of the second interlayer conductors 42 is different between the first surface (2*a*) side and the second surface (2*b*) side of the insulating layer 2, an intermediate thickness between the thickness of the first surface (2*a*) side and the thickness of the second surface (2*b*) side is compared with the thickness (T1*a*) of the end part (41*a*) of each of the first interlayer conductors 41.

Further, in the wiring substrate 1 of the embodiment, the thickness (T1*b*) of the center part (41*b*) of each of the first interlayer conductors 41 can be 1.5 or more and 3 or less times the thickness (T2*b*) of the center part (42*b*) of each of the second interlayer conductors 42. It may be possible that the above-described effect of reducing the difference in electrical resistance between the first and second regions (A1, A2) is obtained, and at the same time, the formation of the first and second interlayer conductors (41, 42) does not require excessive time. Further, the thickness (T1*b*) of the center part (41*b*) of each of the first interlayer conductors 41 can be 1.5 or more and 3 or less times the thickness (T1*a*) of the end part (41*a*) of each of the first interlayer conductors 41. It may be possible that, while an increase in thickness difference with respect to the end part (42*a*) of each of the second interlayer conductors 42 is suppressed in the end part (41*a*), a significant thickness difference as described above with respect to the center part (42*b*) of each of the second interlayer conductors 42 can be realized in the center part (41*b*).

As illustrated in FIG. 3A, the inner wall of each of the first interlayer conductors 41 is curved so as to be convex toward an inner side of the through hole (4*a*) more at the center part (41*b*) than at the end part (41*a*). Specifically, the inner wall of the upper-layer film (40*b*) of each of the first interlayer conductors 41 is curved so as to be convex toward the inner side of the through hole (4*a*) more at the center part (41*b*) than at the end part (41*a*). In contrast, in the cross section illustrated in FIG. 3A, the inner wall of the lower-layer film (40*a*) is substantially flat between the first surface (2*a*) and the second surface (2*b*) of the insulating layer 2, and the thickness of the lower-layer film (40*a*) is substantially constant in the axial direction of the through hole (4*a*). That is, the thickness of the upper-layer film (40*b*) is larger at the center part (41*b*) than at the end part (41*a*) on each of the first surface (2*a*) side and the second surface (2*b*) side of the insulating layer 2. As a result, for each of the first interlayer conductors 41, the thickness (T1*b*) of the center part (41*b*) is larger than the thickness (T1*a*) of the end part (41*a*).

On the other hand, as illustrated in FIG. 3B, the lower-layer film (40*a*) and the upper-layer film (40*b*) of each of the second interlayer conductors 42 each have a thickness that is substantially constant between the first surface (2*a*) and the second surface (2*b*) of the insulating layer 2. Therefore, the thickness of the upper-layer film (40*b*) of each of the first interlayer conductors 41 at the center part (41*b*) is larger than the thickness of the upper-layer film (40*b*) of each of the second interlayer conductors 42 at the center part (42*b*). On the other hand, the thickness of the upper-layer film (40*b*) of each of the first interlayer conductors 41 at the end part (41*a*) is substantially the same as or slightly larger than the thickness of the upper-layer film (40*b*) of each of the second interlayer conductors 42 at the end part (42*a*). The difference between the thickness of the upper-layer film (40*b*) of each of the first interlayer conductors 41 at the center part (41*b*) and the thickness of the upper-layer film (40*b*) of each of the second interlayer conductors 42 at the center part (42*b*) can be 2 or more and 5 or less times the difference between the thickness of the upper-layer film (40*b*) of each of the first interlayer conductors 41 at the end part (41*a*) and the thickness of the upper-layer film (40*b*) of each of the second interlayer conductors 42 at the end part (42*a*). It may be possible that a preferable ratio between the first difference and the second difference regarding the thicknesses of the first interlayer conductors 41 and the second interlayer conductors 42 described above can be obtained.

Next, an example of a method for manufacturing the wiring substrate of the embodiment is described with reference to FIGS. 4A-4H, using a case where the wiring substrate 1 of FIG. 1 is manufactured as an example.

Figure 4A:
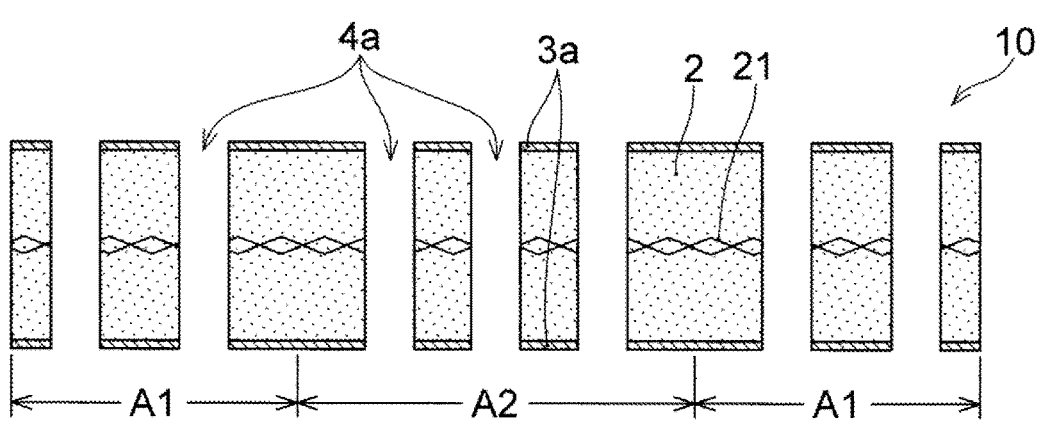
FIG. 4A is a cross-sectional view illustrating an example of a manufacturing process of a wiring substrate according to an embodiment of the present invention.

As illustrated in FIG. 4A, a double-sided copper-clad laminated plate 10 including an insulating layer, which is to become the insulating layer 2 of the wiring substrate 1, and a copper foil (3*a*) laminated on both sides of the insulating layer is prepared, and the multiple through holes (4*a*) are formed. The insulating layer of the double-sided copper-clad laminated plate 10 is formed, for example, using an insulating resin such as epoxy resin, and contains a reinforcing material 21 formed of a glass fiber or the like. The multiple through holes (4*a*) are formed at predetermined positions such that two regions (the first region (A1) and the second region (A2)) with mutually different densities of the through holes (4*a*) are created, the predetermined positions being where the multiple interlayer conductors 4 (see FIG. 1) are to be formed. In the example of FIG. 4A, the second region (A2) having a higher density of the through holes (4*a*) than that of the first region (A1) is created. The through holes (4*a*) are formed, for example, by drilling.

Figure 4B:
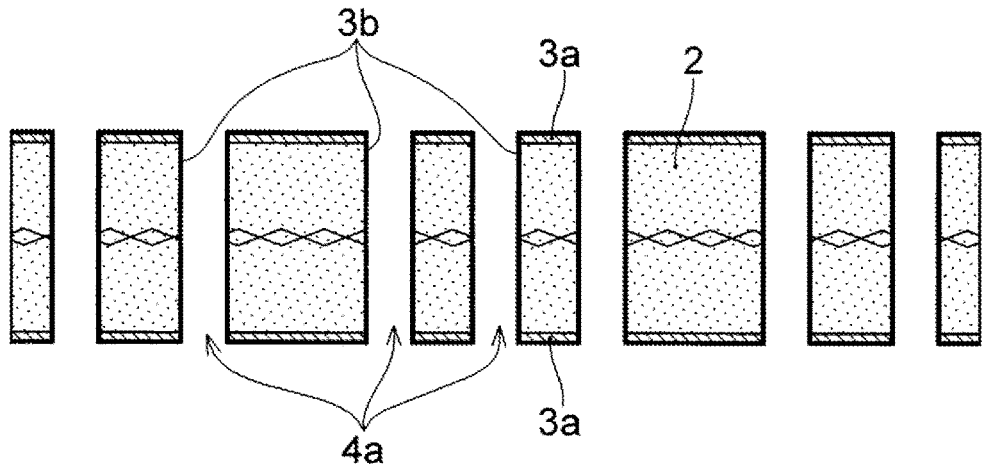
FIG. 4B is a cross-sectional view illustrating an example of a manufacturing process of a wiring substrate according to an embodiment of the present invention.

As illustrated in FIG. 4B, a metal film (3*b*) formed of, for example, copper or the like is formed on inner walls of the insulating layer 2 surrounding the through holes (4*a*) and on an entire surface of the copper foil (3*a*). The metal film (3*b*) is formed, for example, by sputtering or electroless plating. A part of the metal film (3*b*) forms the lower-layer film (40*a*) (see FIGS. 3A and 3B) of each of the first and second interlayer conductors (41, 42) and the second layer (30*b*) (see FIGS. 3A and 3B) of the conductor layers (31, 32).

Figure 4C:
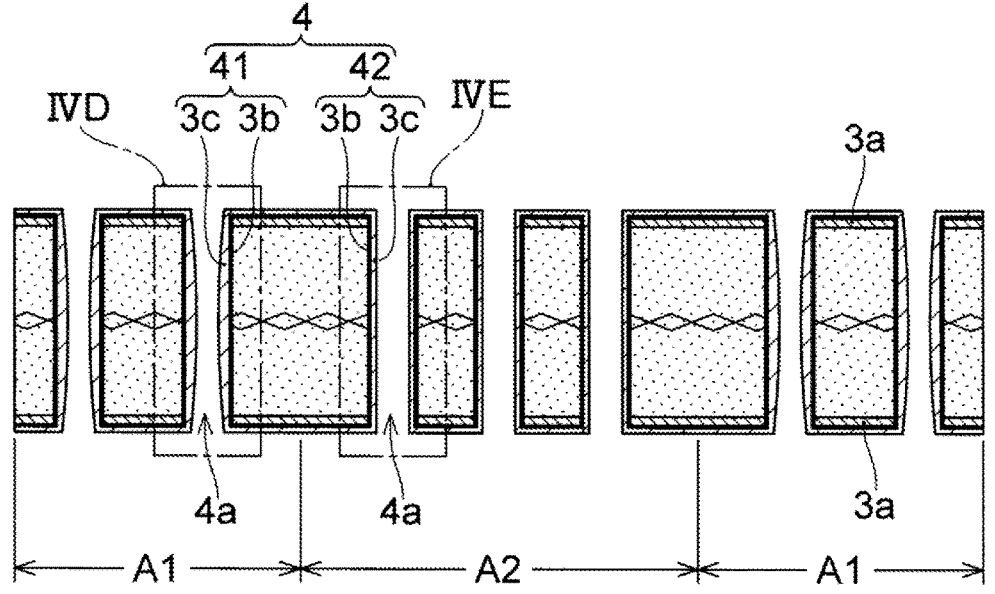
FIG. 4C is a cross-sectional view illustrating an example of a manufacturing process of a wiring substrate according to an embodiment of the present invention.

Then, as illustrated in FIG. 4C, a metal film (3*c*) formed of, for example, copper is formed on an entire surface of the metal film (3*b*). That is, the metal film (3*c*) is formed on the entire surface of the metal film (3*b*) in the through holes (4*a*) and on the entire surface of the metal film (3*b*) on the copper foil (3*a*). The multiple interlayer conductors 4, which each have a tubular structure with a hollow part and are each formed of a part of the metal film (3*b*) and a part of the metal film (3*c*), are formed in the through holes (4*a*). Among the multiple interlayer conductors 4, the first interlayer conductors 41 are formed in the through holes (4*a*) in the first region (A1) and the second interlayer conductors 42 are formed in the through holes (4*a*) in the second region (A2). A part of the metal film (3*c*) forms the upper-layer film (40*b*) (see FIGS. 3A and 3B) of each of the interlayer conductors 4.

Another part of the metal film (3c) forms the third layer (30c) (see FIGS. 3A and 3B) of the conductor layers (31, 32). The metal film (3c) is formed by electrolytic plating using the metal film (3b) as a power feeding layer.

Figure 4D:
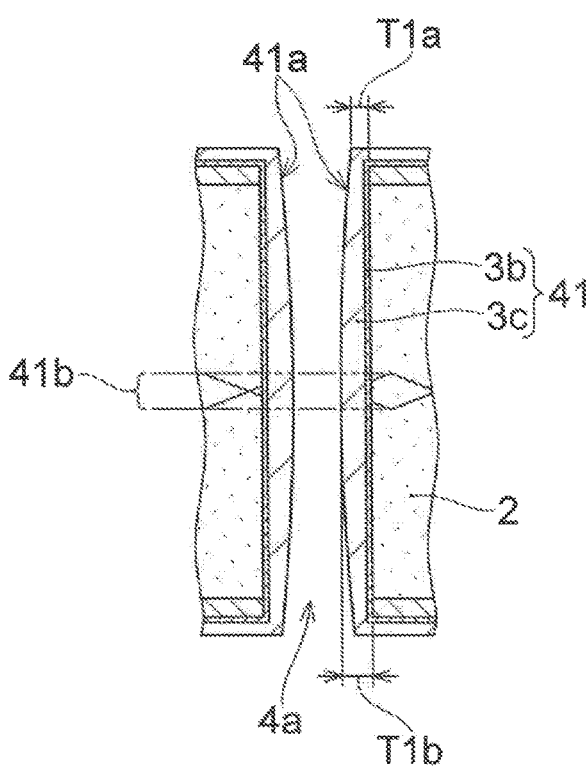
FIG. 4D is a cross-sectional view illustrating an example of a manufacturing process of a wiring substrate according to an embodiment of the present invention.
Figure 4E:
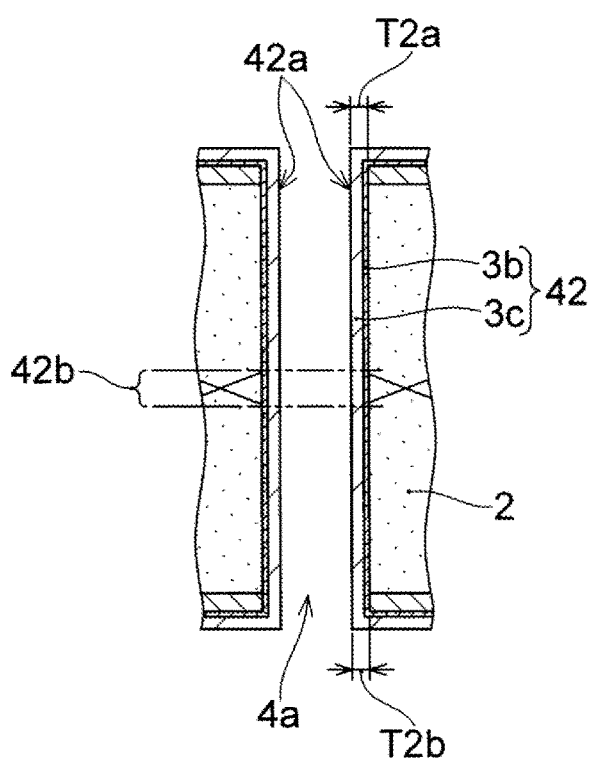
FIG. 4E is a cross-sectional view illustrating an example of a manufacturing process of a wiring substrate according to an embodiment of the present invention.

FIGS. 4D and 4E respectively illustrate enlarged views of a portion (IVD) and a portion (WE) of FIG. 4C. That is, FIG. 4D illustrates an enlarged view of a first interlayer conductor 41 and its surroundings, and FIG. 4E illustrates an enlarged view of a second interlayer conductor 42 and its surroundings. As illustrated in FIGS. 4D and 4E, the metal film (3c) is formed such that the thickness (T1a) of each of the first interlayer conductors 41 at the end part (41a) is substantially the same as or larger than the thickness (T2a) of each of the second interlayer conductors 42 at the end part (42a), and the thickness (T1b) of each of the first interlayer conductors 41 at the center part (41b) is larger than the thickness (T2b) of each of the second interlayer conductors 42 at the center part (42b).

Preferably, the metal film (3c) is formed such that the difference between the thickness (T1b) of each of the first interlayer conductors 41 at the center part (41b) and the thickness (T2b) of each of the second interlayer conductors 42 at the center part (42b) is larger than the difference between the thickness (T1a) of each of the first interlayer conductors 41 at the end part (41a) and the thickness (T2a) of each of the second interlayer conductors 42 at the end part (42a). For example, the metal film (3c) is formed such that the difference between the thickness (T1b) and the thickness (T2b) is two or more times the difference between the thickness (T1a) and the thickness (T2a). Further, the metal film (3c) may be formed such that the thickness (T1b) of each of the first interlayer conductors 41 at the center part (41b) is 1.5 or more times the thickness (T1a) of each of the first interlayer conductors 41 at the end part (41a). As a result, the first interlayer conductors 41 may be formed each having an inner wall that is curved so as to be convex toward an inner side of the through hole (4a) at the center part (41b).

The first interlayer conductors 41 and the second interlayer conductors 42 having the structures illustrated in FIGS. 4D and 4E can be formed, for example, by performing electrolytic plating using pulse plating to form the metal film (3c). In pulse plating, during intervals of energization using the metal film (3b) as a cathode, short-duration reverse energization is periodically performed. During the reverse energization, on a surface part of the insulating layer 2 that is continuously exposed to a flowing plating solution, metal ions once adhered are detached, and thus, a growth rate of a plating film is restricted. On the other hand, portions in the through holes (4a) are less likely to be in contact with a fresh plating solution, and thus, detachment of metal ions is less likely to occur even during the reverse energization. Therefore, compared to the surface part of the insulating layer 2, a growth rate of a plating film is unlikely to be restricted. Further, in the first region (A1), the density of the through holes (4a) is lower than that in the second region (A2), and thus, a current density during energization is high. Therefore, the above-described effect of the pulse plating that causes the difference in growth rate of a plating film between the surface part of the insulating layer 2 and the portions in the through holes (4a) is likely to remarkably occur. As a result, the first interlayer conductors 41 and the second interlayer conductors 42 having the mutually different structures as illustrated in FIGS. 4D and 4E can be formed. Further, it is thought that, by appropriately adjusting a composition or temperature of an electrolytic plating solution and a condition of pulse energization, the first and second interlayer conductors (41, 42) having nearly desired structures, especially, the first interlayer conductors 41 each having a thick center part (41b), can be respectively formed in the first region (A1) and the second region (A2).

Figure 4F:
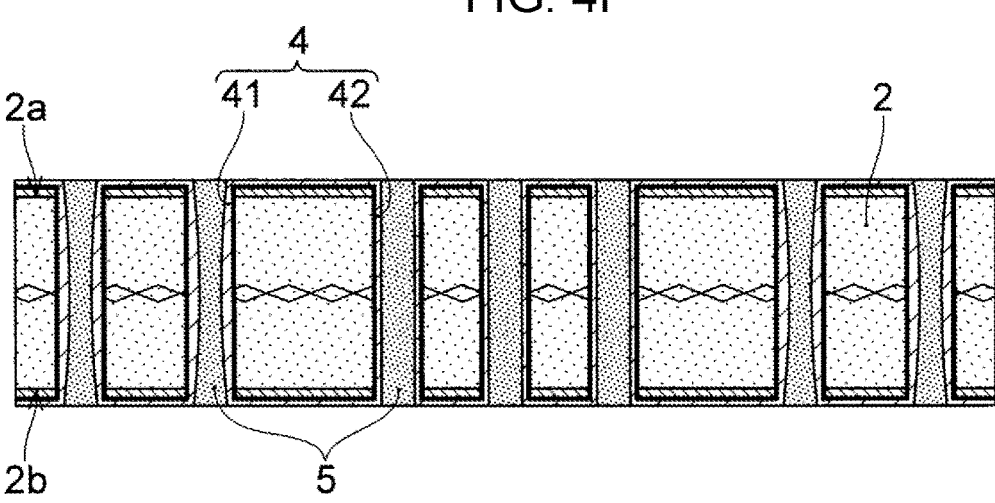
FIG. 4F is a cross-sectional view illustrating an example of a manufacturing process of a wiring substrate according to an embodiment of the present invention.

As illustrated in FIG. 4F, the hollow part of each of the multiple interlayer conductors 4 is filled with the filling body 5. For example, a resin such as an epoxy resin is injected into the hollow part of each of the interlayer conductors 4 from either one or both of the first surface (2a) side and the second surface (2b) side of the insulating layer 2. The resin injected into the hollow part of each of the conductors 4 is solidified by heating or the like when necessary. Optionally, end surfaces of the filling body 5 on the first surface (2a) side and the second surface (2b) side are polished using any method such as chemical mechanical polishing.

Figure 4G:
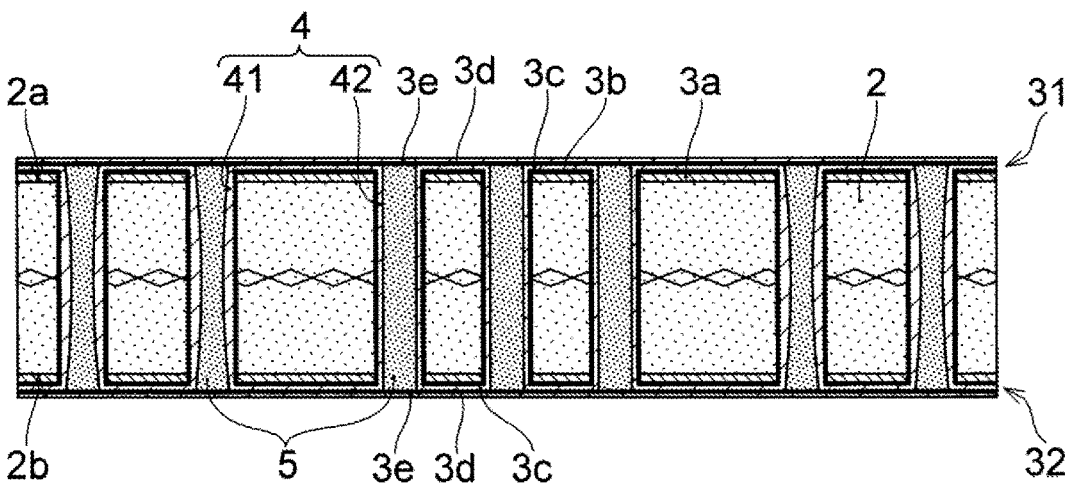
FIG. 4G is a cross-sectional view illustrating an example of a manufacturing process of a wiring substrate according to an embodiment of the present invention.

As illustrated in FIG. 4G, a metal film (3d) formed of, for example, copper or the like is formed on portions of the metal film (3c) on the first surface (2a) and second surface (2b) of the insulating layer 2 and on both end surfaces of the filling body 5. The metal film (3d) is formed, for example, by electroless plating or sputtering. Further, a metal film (3e) formed of, for example, copper or the like is formed on the metal film (3d) by electrolytic plating using the metal film (3d) as a power feeding layer. A so-called lid plating for the interlayer conductors 4 is formed by the metal film (3d) and the metal film (3e). As a result of the formation of the metal films (3d, 3e), the conductor layer 31 and the conductor layer 32 each having a five-layer structure are formed. The conductor layer 31 is formed on the first surface (2a) of the insulating layer 2, and the conductor layer 32 is formed on the second surface (2b) of the insulating layer 2. A part of the metal film (3d) forms the fourth layer (30d) (see FIGS. 3A and 3B) of each of the conductor layers (31, 32), and a part of the metal film (3e) forms the fifth layer (30e) (see FIGS. 3A and 3B) of each of the conductor layers (31, 32).

Figure 4H:
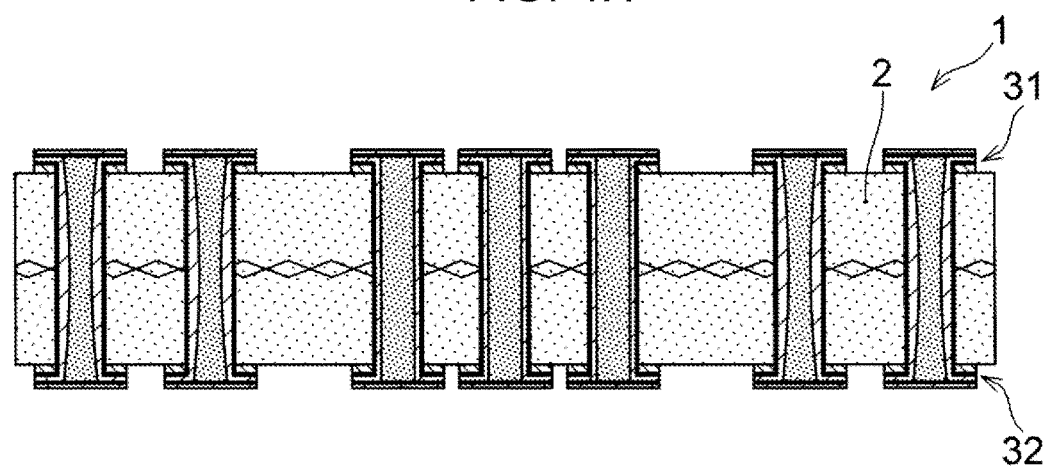
FIG. 4H is a cross-sectional view illustrating an example of a manufacturing process of a wiring substrate according to an embodiment of the present invention.

As illustrated in FIG. 4H, the conductor layers (31, 32) are each patterned to include desired conductor patterns. For example, etching masks each having appropriate openings are respectively provided on the conductor layers (31, 32), and unwanted portions of the conductor layers (31, 32) are removed by wet etching or dry etching. As a result, the wiring substrate 1 illustrated in FIG. 1 is completed.

The wiring substrate of the embodiment is not limited to those having the structures illustrated in the drawings and those having the structures, shapes, and materials exemplified herein. As described above, the wiring substrate of the embodiment can include any number of conductor layers and insulating layers in addition to the insulating layer 2 and the conductor layers (31, 32) in the example of FIG. 1. It is also possible that the hollow part of each of the interlayer conductors 4 remains hollow without being filled with the filling body 5. It is also possible that the inner wall of each of the second interlayer conductors 42 is curved toward an inner side of the through hole (4a) at the center part (42b).

Japanese Patent Application Laid-Open Publication No. 2014-192432 describes a wiring substrate in which three groups of through holes are respectively formed at mutually different densities in regions of a core substrate.

In the wiring substrate disclosed in Japanese Patent Application Laid-Open Publication No. 2014-192432, it is thought that there is a difference in the number of through holes connected to conductor patterns of the same size between a region where a density of a through hole group is high and a region where a density of a through hole group is low. Therefore, it may be possible that electrical resistance between front and back conductor patterns of the core substrate connected by the through holes is different between a region where a density of a through hole group is high and a region where a density of a through hole group is low. It may be possible that a difference in electrical characteristics occurs for each region in each conductor layer and a desired performance in a device using the wiring substrate cannot be obtained.

A wiring substrate according to an embodiment of the present invention includes: an insulating layer that has two opposing surfaces and is provided with through holes penetrating between the two surfaces; a first conductor layer and a second conductor layer that are respectively formed on the two surfaces; multiple interlayer conductors that are respectively formed in film-like shapes along a wall surface surrounding the through holes and connect the first conductor layer and the second conductor layer; and a first region and a second region, in each of which some of the multiple interlayer conductors are formed. The multiple interlayer conductors include first interlayer conductors that are formed in the first region, and second interlayer conductors that are formed in the second region at a density higher than that of the first interlayer conductors in the first region. A thickness of an end part of each of the first interlayer conductors in a thickness direction of the insulating layer is substantially the same as or larger than a thickness of an end part of each of the second interlayer conductors in the thickness direction. A thickness of a center part of each of the first interlayer conductors in the thickness direction is larger than a thickness of a center part of each of the second interlayer conductors in the thickness direction.

According to an embodiment of the present invention, it is possible that variation in electrical resistance between front and back conductor layers of the wiring substrate and unevenness in thickness of each conductor layer, which are due to a difference in density between the regions of the interlayer conductors that connect the front and back conductor layers, are small.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
an insulating layer having a plurality of through holes;
a first conductor layer formed on a first surface of the insulating layer;
a second conductor layer formed on a second surface of the insulating layer; and
a plurality of interlayer conductors formed along wall surfaces surrounding the through holes respectively such that each of the interlayer conductors has a film-like shape forming a tubular structure with a hollow part and is connecting the first conductor layer and the second conductor layer,
wherein the plurality of interlayer conductors includes a plurality of first interlayer conductors formed in a first region of the insulating layer and a plurality of second interlayer conductors formed in a second region of the insulating layer at a density higher than a density of the first interlayer conductors in the first region, and the plurality of interlayer conductors is formed such that a thickness of each of the first interlayer conductors in an end part of each of the first interlayer conductors is substantially same as or larger than a thickness of each of the second interlayer conductors in an end part of each of the second interlayer conductors and that a thickness of each of the first interlayer conductors in a center part of each of the first interlayer conductors is larger than a thickness of each of the second interlayer conductors in a center part of each of the second interlayer conductors.

2. The wiring substrate according to claim 1, wherein the plurality of interlayer conductors is formed such that a first difference in thickness between the center part of each of the first interlayer conductors and the center part of each of the second interlayer conductors is larger than a second difference in thickness between the end part of each of the first interlayer conductors and the end part of each of the second interlayer conductors.

3. The wiring substrate according to claim 2, wherein the plurality of interlayer conductors is formed such that the first difference is in a range of 2 to 5 times the second difference.

4. The wiring substrate according to claim 1, wherein the plurality of interlayer conductors is formed such that the thickness of the center part of each of the first interlayer conductors is in a range of 1.5 to 3 times the thickness of the center part of each of the second interlayer conductors.

5. The wiring substrate according to claim 1, wherein the plurality of interlayer conductors is formed such that the thickness of the center part of each of the first interlayer conductors is in a range of 1.5 to 3 times the thickness of the end part of each of the first interlayer conductors.

6. The wiring substrate according to claim 1, wherein the plurality of interlayer conductors is formed such that each of the first and second interlayer conductors includes a lower-layer film formed in contact with the wall surface, and an upper-layer film formed on the lower-layer film and comprising an electrolytic plating film, and the plurality of interlayer conductors is formed such that a difference between a thickness of the upper-layer film of each of the first interlayer conductors in the center part and a thickness of the upper-layer film of each of the second interlayer conductors in the center part is in a range of 2 to 5 times a difference between a thickness of the upper-layer film of each of the first interlayer conductors in the end part of each of the first interlayer conductors and a thickness of the upper-layer film of each of the second interlayer conductors in the end part of each of the second interlayer conductors.

7. The wiring substrate according to claim 1, wherein the plurality of interlayer conductors is formed such that a density of the first interlayer conductors in the first region is in a range of 0.6 conductors/mm$^2$ to 1.2 conductors/mm$^2$ and that a density of the second interlayer conductors in the second region is in a range of 6 conductors/mm$^2$ to 10 conductors/mm$^2$.

8. The wiring substrate according to claim 1, wherein the insulating layer has a thickness in a range of 1.0 mm to 2.0 mm.

9. The wiring substrate according to claim 1, wherein the insulating layer is formed such that each of the through holes has an inner diameter in a range of 150 μm to 200 μm.

10. The wiring substrate according to claim 2, wherein the plurality of interlayer conductors is formed such that the thickness of the center part of each of the first interlayer conductors is in a range of 1.5 to 3 times the thickness of the center part of each of the second interlayer conductors.

11. The wiring substrate according to claim 2, wherein the plurality of interlayer conductors is formed such that the thickness of the center part of each of the first interlayer conductors is in a range of 1.5 to 3 times the thickness of the end part of each of the first interlayer conductors.

12. The wiring substrate according to claim 2, wherein the plurality of interlayer conductors is formed such that each of the first and second interlayer conductors includes a lower-layer film formed in contact with the wall surface, and an upper-layer film formed on the lower-layer film and comprising an electrolytic plating film, and the plurality of interlayer conductors is formed such that a difference between a thickness of the upper-layer film of each of the first interlayer conductors in the center part and a thickness of the upper-layer film of each of the second interlayer conductors in the center part is in a range of 2 to 5 times a difference between a thickness of the upper-layer film of each of the first interlayer conductors in the end part of each of the first interlayer conductors and a thickness of the upper-layer film of each of the second interlayer conductors in the end part of each of the second interlayer conductors.

13. The wiring substrate according to claim 2, wherein the plurality of interlayer conductors is formed such that a density of the first interlayer conductors in the first region is in a range of 0.6 conductors/mm$^2$ to 1.2 conductors/mm$^2$ and that a density of the second interlayer conductors in the second region is in a range of 6 conductors/mm$^2$ to 10 conductors/mm$^2$.

14. The wiring substrate according to claim 2, wherein the insulating layer has a thickness in a range of 1.0 mm to 2.0 mm.

15. The wiring substrate according to claim 2, wherein the insulating layer is formed such that each of the through holes has an inner diameter in a range of 150 μm to 200 μm.

16. The wiring substrate according to claim 3, wherein the plurality of interlayer conductors is formed such that the thickness of the center part of each of the first interlayer conductors is in a range of 1.5 to 3 times the thickness of the center part of each of the second interlayer conductors.

17. The wiring substrate according to claim 3, wherein the plurality of interlayer conductors is formed such that the thickness of the center part of each of the first interlayer conductors is in a range of 1.5 to 3 times the thickness of the end part of each of the first interlayer conductors.

18. The wiring substrate according to claim 3, wherein the plurality of interlayer conductors is formed such that each of the first and second interlayer conductors includes a lower-layer film formed in contact with the wall surface, and an upper-layer film formed on the lower-layer film and comprising an electrolytic plating film, and the plurality of interlayer conductors is formed such that a difference between a thickness of the upper-layer film of each of the first interlayer conductors in the center part and a thickness of the upper-layer film of each of the second interlayer conductors in the center part is in a range of 2 to 5 times a difference between a thickness of the upper-layer film of each of the first interlayer conductors in the end part of each of the first interlayer conductors and a thickness of the upper-layer film of each of the second interlayer conductors in the end part of each of the second interlayer conductors.

19. The wiring substrate according to claim 3, wherein the plurality of interlayer conductors is formed such that a density of the first interlayer conductors in the first region is in a range of 0.6 conductors/mm$^2$ to 1.2 conductors/mm$^2$ and that a density of the second interlayer conductors in the second region is in a range of 6 conductors/mm$^2$ to 10 conductors/mm$^2$.

20. The wiring substrate according to claim 3, wherein the insulating layer has a thickness in a range of 1.0 mm to 2.0 mm.

* * * * *